United States Patent
Ido et al.

(10) Patent No.: US 9,564,292 B2
(45) Date of Patent: Feb. 7, 2017

(54) ION BEAM MEASURING DEVICE AND METHOD OF MEASURING ION BEAM

(71) Applicant: Sumitomo Heavy Industries Ion Technology Co., Ltd., Tokyo (JP)

(72) Inventors: Noriyasu Ido, Ehime (JP); Kouji Inada, Ehime (JP); Kazuhiro Watanabe, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/314,448

(22) Filed: Jun. 25, 2014

(65) Prior Publication Data
US 2015/0001418 A1    Jan. 1, 2015

(51) Int. Cl.
*H01J 37/304* (2006.01)
*H01J 37/317* (2006.01)
*H01J 37/244* (2006.01)

(52) U.S. Cl.
CPC .......... *H01J 37/3171* (2013.01); *H01J 37/244* (2013.01); *H01J 2237/24405* (2013.01); *H01J 2237/24528* (2013.01); *H01J 2237/24535* (2013.01)

(58) Field of Classification Search
USPC ....................................................... 250/397
See application file for complete search history.

(56) References Cited

U.S. PATENT DOCUMENTS

| | | | |
|---|---|---|---|
| 6,791,094 B1 * | 9/2004 | Olson ................... | H01J 37/304 250/396 ML |
| 6,989,545 B1 | 1/2006 | Rathmell et al. | |
| 7,897,944 B2 * | 3/2011 | Mitchell ............... | H01J 37/304 250/492.21 |
| 8,164,068 B2 * | 4/2012 | Riordon et al. ............... | 250/397 |
| 8,461,030 B2 * | 6/2013 | Renau ................. | H01J 37/3171 257/E21.334 |
| 9,343,263 B2 * | 5/2016 | Sasaki ................... | H01J 37/244 |
| 2002/0050573 A1 * | 5/2002 | Suguro ............... | H01J 37/3171 250/492.21 |
| 2002/0121889 A1 | 9/2002 | Larsen et al. | |
| 2009/0314959 A1 | 12/2009 | Gammel et al. | |
| 2010/0013833 A1 | 1/2010 | Gandikota et al. | |

FOREIGN PATENT DOCUMENTS

| | | |
|---|---|---|
| JP | 2008-506239 A | 2/2008 |
| JP | 2009-524195 A | 6/2009 |
| JP | 2010-050108 A | 3/2010 |
| JP | 2011-517837 A | 6/2011 |
| WO | WO-2007/087209 A1 | 8/2007 |

* cited by examiner

*Primary Examiner* — Phillip A Johnston
(74) *Attorney, Agent, or Firm* — Michael Best & Friedrich LLP

(57) ABSTRACT

An ion beam measuring device includes: a mask that is used for shaping an original ion beam into a measuring ion beam including a y beam part elongated in a y direction that is perpendicular to a traveling direction of the ion beam and an x beam part elongated in an x direction that is perpendicular to the traveling direction and the y direction; a detection unit that is configured to detect an x-direction position of the y beam part and a y-direction position of the x beam part; and a beam angle calculating unit that is configured to calculate an x-direction beam angle using the x-direction position and a y-direction beam angle using the y-direction position.

19 Claims, 12 Drawing Sheets

ION BEAM MEASURING DEVICE AND METHOD OF MEASURING ION BEAM

BACKGROUND OF THE INVENTION

1. Field of the Invention

The present invention relates to an ion beam measuring device and a method of measuring an ion beam that are appropriate for an ion implantation apparatus.

2. Description of the Related Art

Methods for measuring the angle of the traveling direction of an ion beam have been known. In such a method, for example, a mask plate having small circular holes that allow a part of a ribbon-shaped ion beam to pass therethrough is arranged on the upstream side of a beam monitor. In another method, a flag moved by a translation mechanism is used, and the flag has first and second shapes that enable the measurement of the angle of the ion beam. The first shape is the shape of a perpendicular slot, and the second shape is the shape of an inclined edge.

In an ion implantation process, the angle of an ion beam to be implanted is controlled or managed. Particularly, in the ion implantation of a high energy region, the angle has been desired to be controlled or managed with high precision. However, in such a region, generally, the beam current is small, and accordingly, it is not easy to perform high-precision measurement. As described above, when the passage of a beam is restricted by the small circular holes of the mask plate, the beam current is extremely small, and accordingly, it may be difficult to perform measurement with required precision. In addition, it is complicated to measure beam angles of two directions perpendicular to the traveling direction of an ion beam by using the movable inclined edge.

SUMMARY OF THE INVENTION

An illustrative object of an aspect of the present invention is to provide an ion beam measuring device and a method of measuring an ion beam that are capable of measuring beam angles of two directions by employing a simple configuration.

According to one aspect of the present invention, there is provided an ion beam measuring device including: a mask that is used for shaping an original ion beam into a measuring ion beam including a y beam part elongated in a y direction that is perpendicular to an ion beam traveling direction and an x beam part elongated in an x direction that is perpendicular to the traveling direction and the y direction; a detection unit that is configured to detect an x-direction position of the y beam part and a y-direction position of the x beam part; and a beam angle calculating unit that is configured to calculate an x-direction beam angle using the x-direction position and a y-direction beam angle using the y-direction position.

According to another aspect of the present invention, there is provided a method of measuring an ion beam including: preparing a measuring ion beam that includes a y beam part elongated in a y direction that is perpendicular to an ion beam traveling direction and an x beam part elongated in an x direction that is perpendicular to the traveling direction and the y direction; detecting an x-direction position of the y beam part; detecting a y-direction position of the x beam part; calculating an x-direction beam angle using the x-direction position; and calculating a y-direction beam angle using the y-direction position.

Optional combinations of the aforementioned constituting elements, and implementations of the invention in the form of methods, apparatuses, and systems, may also be practiced as additional modes of the present invention.

BRIEF DESCRIPTION OF THE DRAWINGS

Embodiments will now be described, byway of example only, with reference to the accompanying drawings that are meant to be exemplary, not limiting, and wherein like elements are numbered alike in several figures, in which.

DETAILED DESCRIPTION OF THE INVENTION

Figure 1:
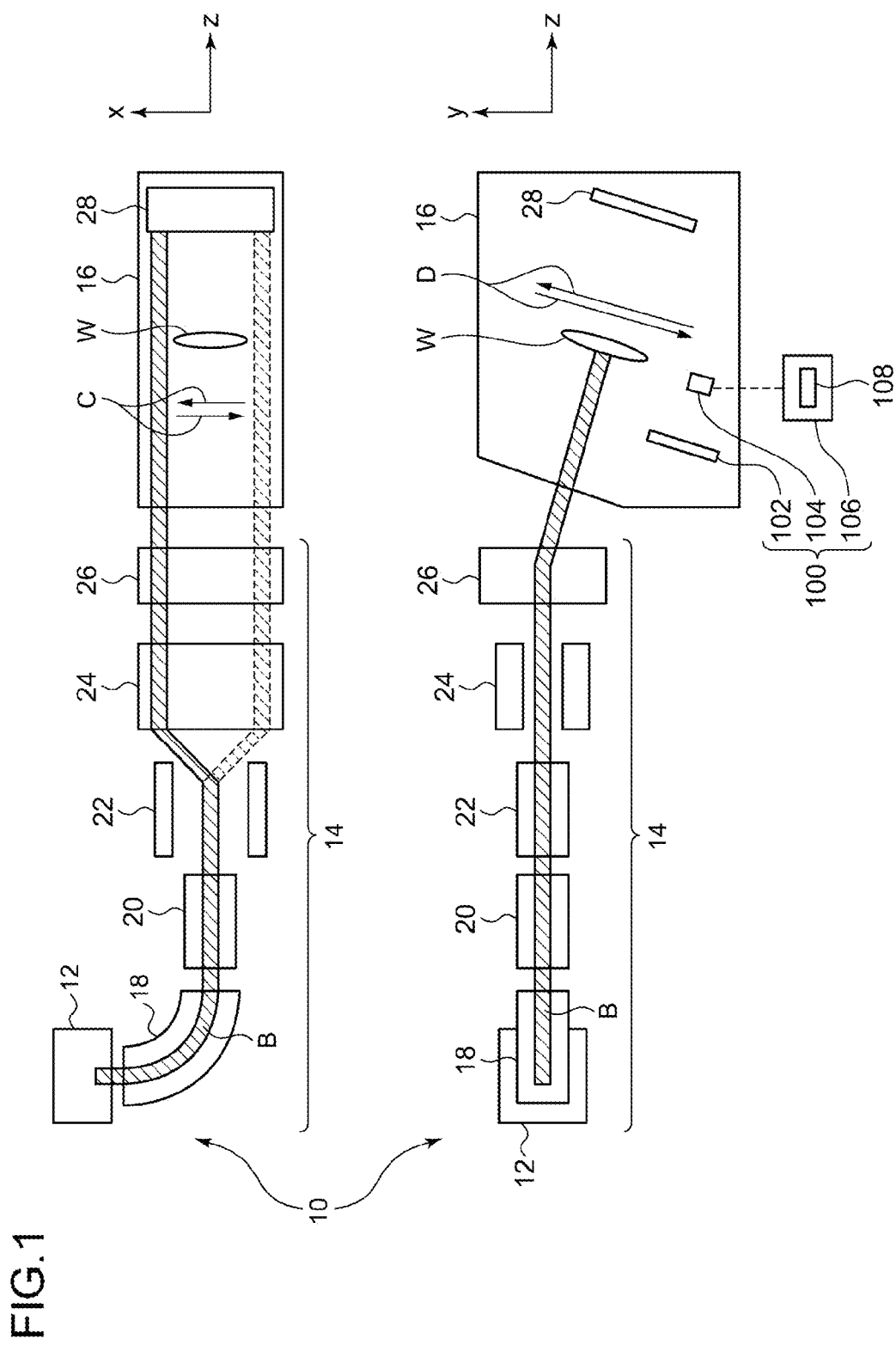
FIG. 1 is a schematic diagram that illustrates an ion implantation apparatus according to a first embodiment of the present invention.

The invention will now be described by reference to the preferred embodiments. This does not intend to limit the scope of the present invention, but to exemplify the invention.

Hereinafter, embodiments of the present invention will be described in detail with reference to the drawings. The same reference sign will be assigned to the same element in the drawings, and duplicate description thereof will not be presented as is appropriate. The configurations described below are merely examples but are not for purposes of limiting the scope of the present invention.

First Embodiment

FIG. 1 is a schematic diagram that illustrates an ion implantation apparatus 10 according to a first embodiment of the present invention. The upper part of FIG. 1 is a top view that illustrates a schematic configuration of the ion implantation apparatus 10, and the lower part of FIG. 1 is a side view that illustrates a schematic configuration of the ion implantation apparatus 10.

The ion implantation apparatus 10 is configured to perform an ion implantation process for the surface of a workpiece W. The workpiece W, for example, is a substrate such as a semiconductor wafer. Thus, hereinafter, for the convenience of description, while the workpiece W may be referred to as a substrate W, but it does not intend to limit the target of the implantation process to a specific object.

The ion implantation apparatus 10 is configured to irradiate the entire substrate W with an ion beam B by using at least one of beam scanning and mechanical scanning. Here, for the convenience of description, the traveling direction of the ion beam B in design is defined as a z direction, and a plane that is perpendicular to the z direction is defined as an xy plane. As will be described later, in a case where the ion beam B is scanned with respect to the workpiece W, the scanning direction is defined as an x direction, and a direction that is perpendicular to the z direction and the x direction is defined as a y direction. Accordingly, the beam scanning is performed in the x direction, and the mechanical scanning is performed in the y direction.

The ion implantation apparatus 10 includes an ion source 12, a beamline device 14, and a vacuum processing chamber 16. The ion source 12 is configured to supply the ion beam B to the beamline device 14. The beamline device 14 is configured to transport ions from the ion source 12 to the vacuum processing chamber 16. In addition, the ion implantation apparatus 10 includes a vacuum pumping system (not illustrated in the figure) that is used for providing a desired vacuum environment for the ion source 12, the beamline device 14, and the vacuum processing chamber 16.

As illustrated in the figure, the beamline device 14, for example, includes: a mass analyzing magnet device 18; a beam focusing/defocusing device 20; a deflection scanning device 22; a P lens 24 or a beam parallelizing device; and an angular energy filter 26 in order from the upper stream side. In description presented here, the upper stream or upstream side represents a side that is close to the ion source 12, and the lower stream or downstream side represents a side that is close to the vacuum processing chamber 16 (or a beam stopper 28).

The mass analyzing magnet device 18 is disposed on the downstream side of the ion source 12 and is configured to select a required ion species from the ion beam B extracted out from the ion source 12 through mass analysis. The beam focusing/defocusing device 20 includes a focusing lens such as a Q lens and is configured to focus or defocus the ion beam B into a desired cross-sectional shape.

In addition, the deflection scanning device 22 is configured to provide beam scanning. The deflection scanning device 22 scans the ion beam B in the x direction. In this way, the ion beam B is scanned across an x-direction scanning range longer than its y-direction width. In FIG. 1, beam scanning and the scanning range thereof are denoted by arrows C as an example, and ion beam B at one end and ion beam B at the other end of the scanning range are denoted by a solid line and a broken line, respectively. For clarification, diagonal lines are applied to the ion beam B in the figure.

The P lens 24 is configured to parallelize the traveling direction of the scanned ion beam B. The angular energy filter 26 is configured to analyze energy of the ion beam B, deflect ions having required energy downward, and lead the deflected ions to the vacuum processing chamber 16. In this way, the beamline device 14 supplies the ion beam B to the vacuum processing chamber 16 to irradiate the substrate W.

The vacuum processing chamber 16 includes an object holder (not illustrated in the figure) configured to hold one or more substrates W and to provide relative movement (so-called mechanical scanning) of the substrate W with respect to the ion beam B, for example, in y-direction, as is necessary. In FIG. 1, the mechanical scanning is denoted by arrows D as an example. In addition, the vacuum processing chamber 16 includes the beam stopper 28. In a case where the substrate W is not present on the ion beam B, the ion beam B is incident on the beam stopper 28.

In an embodiment, the ion implantation apparatus 10 may be configured to supply an ion beam having a longer cross-section in a direction perpendicular to the z direction to the vacuum processing chamber 16. In such a case, for example, the ion beam has an x-direction width that is longer than a y-direction width thereof. The ion beam having such an elongated cross-section may also be referred to as a ribbon beam. Alternatively, in a further embodiment, the ion implantation apparatus 10 may be configured to supply an ion beam having a spot-shaped cross-section to the vacuum processing chamber 16 without scanning the ion beam.

Described in detail later with reference to FIGS. 2 to 5, an ion beam measuring device 100 is provided with the vacuum processing chamber 16. The ion beam measuring device 100 includes a mask 102 that is used for shaping the original ion beam B into a measuring ion beam Bm and a detection unit 104 that is configured to detect the measuring ion beam Bm.

As illustrated in the lower part of FIG. 1, when the ion beam B is irradiated onto the substrate W, the mask 102 and the detection unit 104 are located at retreat positions that deviate from the ion beam B. At this time, the ion beam B is not irradiated on the mask 102 and the detection unit 104. At the time of measurement, the mask 102 and the detection unit 104 are moved to measurement positions (see FIG. 2) traversing the ion beam B by a moving mechanism not illustrated in the figure. At this time, the mask 102 is located between the angular energy filter 26 and the detection unit 104 on the path of the ion beam B, and the detection unit 104 is located at a position in the z direction at which the surface of the substrate W is placed during the ion implantation process.

In addition, the ion beam measuring device 100 includes a measurement control unit 106 that is used for performing an ion beam measuring process. The measurement control unit 106 may be configured as a part of a control device that is configured to control the ion implantation apparatus 10 or may be configured to be separate from the control device. The measurement control unit 106 may be configured to control the movement of the mask 102 and the detection unit 104 between the retreat positions and the measurement positions described above. In an embodiment, the ion implantation apparatus 10 may be configured to control the ion implantation process based on a measurement result acquired by the ion beam measuring device 100.

The measurement control unit 106 includes a beam angle calculating unit 108 that is configured to calculate an angle formed by the actual traveling direction of the ion beam. B with respect to the z direction that is the designed traveling direction based on the output of the detection unit 104 that represents a detection result. The beam angle calculating unit 108 is configured to calculate an x-direction beam angle using the x-direction position of a y beam part of the measuring ion beam Bm and calculate a y-direction beam angle using the y-direction position of an x beam part of the measuring ion beam Bm.

Figure 2:
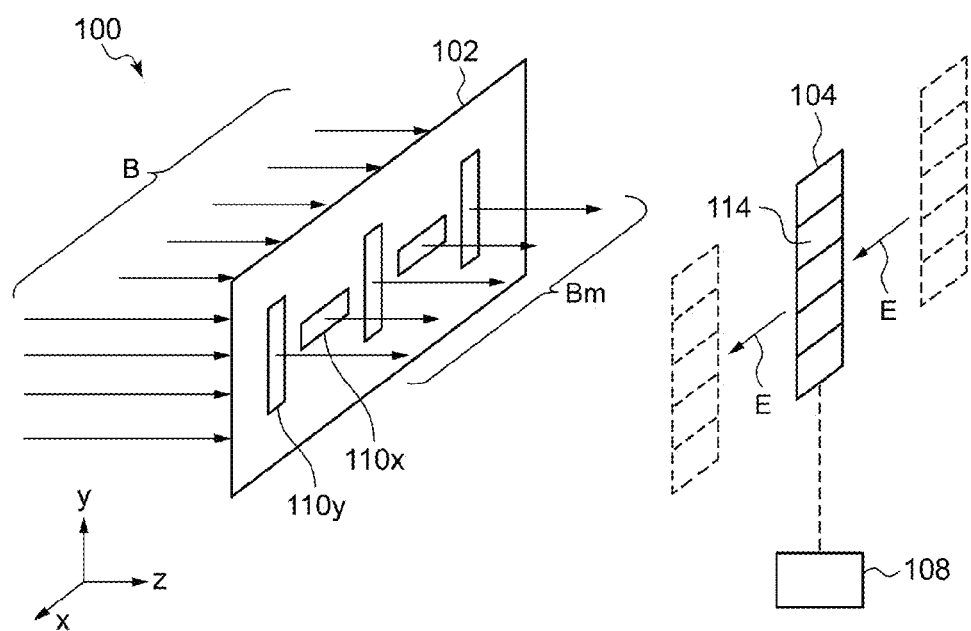
FIG. 2 is a schematic diagram that illustrates an ion beam measuring device according to the first embodiment of the present invention.
Figure 3:
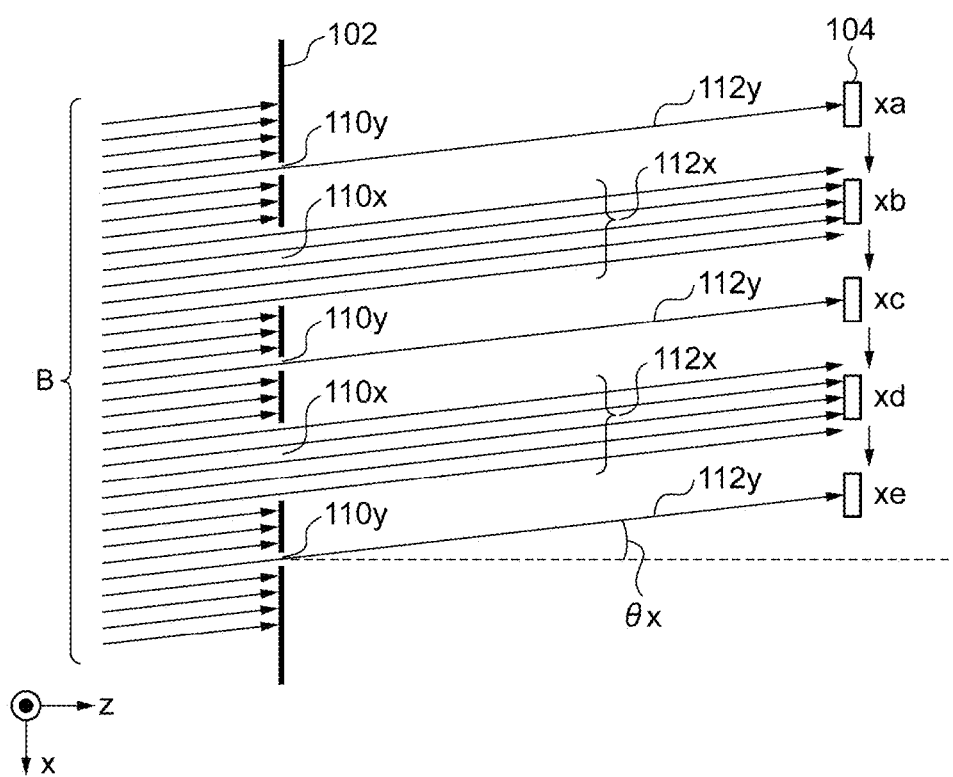
FIG. 3 is a diagram that is acquired when the ion beam measuring device illustrated in FIG. 2 is cut at the center of a mask in the y direction and is viewed in the y direction.
Figure 4:
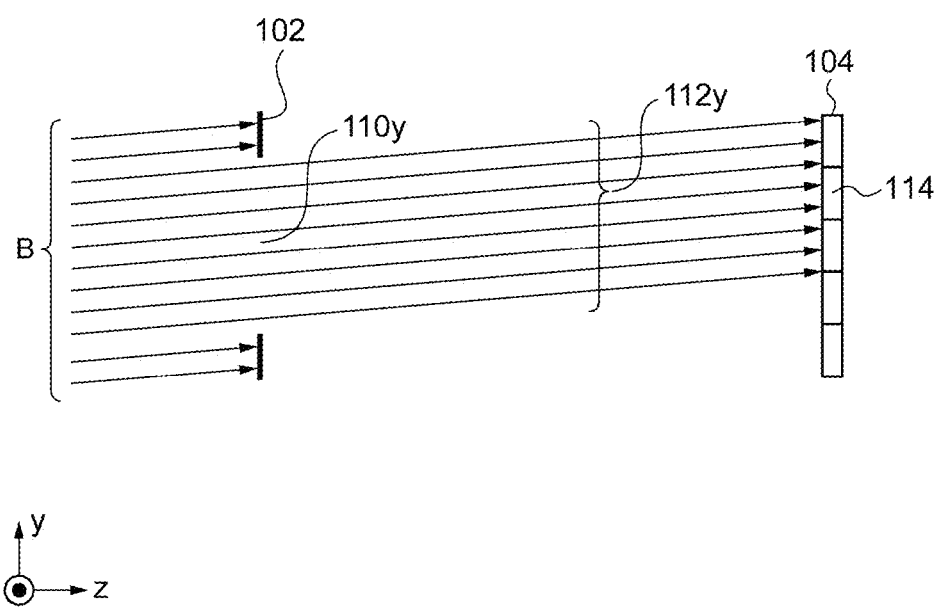
FIG. 4 is a diagram that is acquired when the ion beam measuring device illustrated in FIG. 2 is cut at a position of a y slit of the mask in the x direction and is viewed in the x direction.
Figure 5:
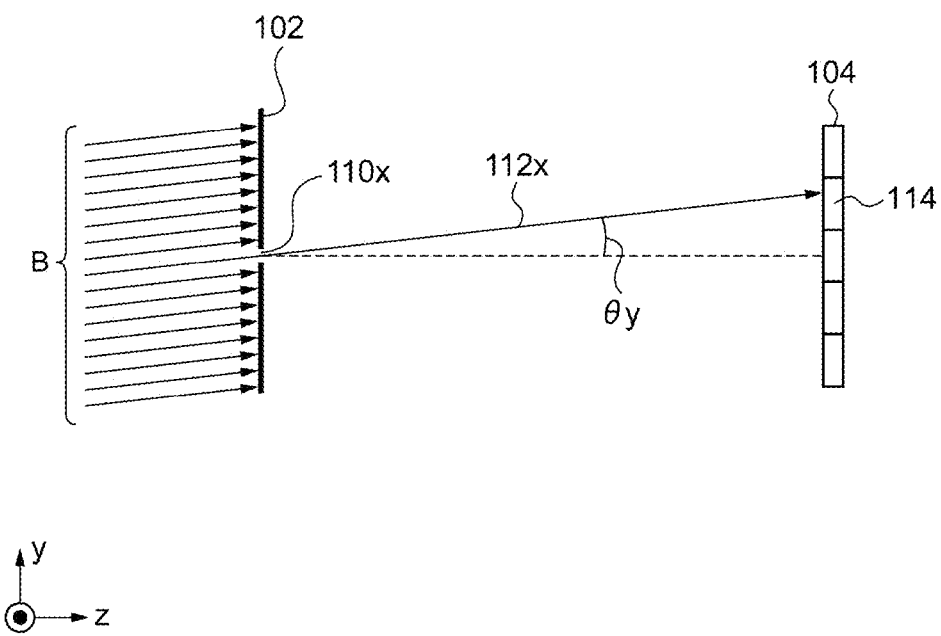
FIG. 5 is a diagram that is acquired when the ion beam measuring device illustrated in FIG. 2 is cut at a position of an x slit of the mask in the x direction and is viewed in the x direction.

FIG. 2 is a schematic diagram that illustrates the ion beam measuring device 100 according to the first embodiment of the present invention. FIG. 3 is a diagram that is acquired when the ion beam measuring device 100 illustrated in FIG. 2 is cut at the center of the mask 102 in the y direction and is viewed in the y direction. FIG. 4 is a diagram that is acquired when the ion beam measuring device 100 illustrated in FIG. 2 is cut at a position of a y slit 110y of the mask 102 in the x direction and is viewed in the x direction. FIG. 5 is a diagram that is acquired when the ion beam measuring device 100 illustrated in FIG. 2 is cut at a position of an x slit 110x of the mask 102 in the x direction and is viewed in the x direction.

The mask 102 is configured to generate the measuring ion beam Bm by partially transmitting the ion beam B supplied from the upstream side. The measuring ion beam Bm includes the y beam part 112y and the x beam part 112x (see FIGS. 3 to 5). The y beam part 112y has a cross-section elongated in the y direction on the xy plane. In addition, the x beam part 112x has a cross-section elongated in the x direction on the xy plane.

The mask 102 includes a plate-shaped member having a plurality of slits or openings to allow the ion beam B to pass therethrough. The plurality of slits formed on the mask 102 include a y slit 110y that are elongated in the y direction and a x slit 110x that are elongated in the x direction. In description presented here, a portion of the mask 102 in which the y slit 110y is formed may be referred to as a "first mask part" and a portion of the mask 102 in which the x slit 110x is formed may be referred to as a "second mask part".

The mask 102 illustrated in FIG. 2 includes three first mask parts and two second mask parts in an irradiated region on the mask 102 on which the original ion beam B is incident. Such first mask parts and second mask parts are alternately arranged in the x direction. Each first mask part includes one y slit 110y, and each second mask part includes one x slit 110x.

Accordingly, the mask 102 includes three y slits 110y and two x slits 110x, and the y slits 110y and the x slits 110x are arranged alternately in the x direction. The center y slit 110y is located at the center of the irradiated region on the mask 102 in the x direction on which the ion beam B is incident. The remaining two y slits 110y are located at the end portions of the irradiated region on the mask 102 in the x direction. Meanwhile, the two x slits 110x are located at the same position in the y direction that is at the center of the irradiated region on the mask 102 in the y direction.

The y slit 110y is a through hole having a shape corresponding to the y beam part 112y. Accordingly, the y slit 110y has a certain narrow slit width in the x direction and a slit length longer than the slit width in the y direction. On the other hand, the x slit 110x is a through hole having a shape corresponding to the x beam part 112x. Accordingly, the x slit 110x has a certain narrow slit width in the y direction and a slit length longer than the slit width in the x direction.

The slit lengths of the y slit 110y and the x slit 110x are markedly longer than the slit widths thereof, and, for example, the slit length is at least ten times the slit width. It is preferable to narrow the slit width in a case where the precision of the measurement is significant, and it is preferable to broaden the slit width in a case where the shortening of the measurement time is significant. The slit length of the y slit 110y is determined in accordance with the width of the ion beam B in the y direction.

In addition, in the mask 102, a gap between two adjacent slits is determined such that two adjacent beam parts of the measuring ion beam Bm corresponding to the adjacent slits are separate from each other when the measuring ion beam Bm is incident on the detection unit 104. As illustrated in FIG. 3, a gap between the y slit 110y and the x slit 110x adjacent to each other in the x direction is determined such that the y beam part 112y and the x beam part 112x adjacent to each other do not overlap each other at a position of the detection unit 104 in the z direction. By doing this, mixing of the beam parts adjacent to each other due to divergence of each beam part until the arrival of each beam part at the detection unit 104 from the mask 102 can be avoided.

The ion beam B is irradiated to the first mask part and passes through the y slit 110y, whereby the y beam part 112y is generated. In addition, the ion beam B is irradiated to the second mask part and passes through the x slit 110x, whereby the x beam part 112x is generated. In accordance with the arrangement of the y slits 110y and the x slits 110x on the mask 102, a measuring ion beam Bm in which three y beam parts 112y and two x beam parts 112x are alternately arranged in the x direction is generated.

While detection is performed by the detection unit 104, the mask 102 is stopped. Accordingly, the y beam part 112y and the x beam part 112x correspond to specific parts cut out from the original ion beam B. Accordingly, the y beam part 112y and the x beam part 112x maintain beam angles at specific positions of the ion beam B in the xy plane.

The detection unit 104 is configured to detect an x-direction position of the y beam part 112y and an y-direction position of the x beam part 112x. The detection unit 104 includes a moving detector that is movable in the x direction so as to traverse the measuring ion beam Bm. The movement of the detection unit 104 in the x direction is denoted by arrows E in FIG. 2 as an example. In accordance with the movement of the detector in the x direction, the position of the y beam part 112y in the x direction is detected. In addition, the detection unit 104 includes a plurality of detection elements 114 arranged in the y direction. Based on the arrival position of the x beam part 112x in the detection unit 104, the position of the x beam part 112x in the y direction is detected.

In this way, the detection unit 104 can detect the position of the y beam part 112y in the x direction and the position of the x beam part 112x in the y direction while the moving detector traverses the measuring ion beam Bm once.

The detection unit 104 or each detection element 114, for example, includes an element that generates a current in accordance with the amount of incident ions or may have any configuration for detecting an ion beam. The detection unit 104 or each detection element 114, for example, may be a Faraday cup. Here, while five detection elements 114 are representatively exemplified in the detection unit 104 illustrated in the figure, the detection unit 104, typically, may include an array of detection elements 114 which has five or more (for example, at least ten) detection elements 114.

As illustrated in FIG. 3, when the detection unit 104 moves in the x direction for detecting the measuring ion beam Bm, for example, at a position xa in the x direction, the detection unit 104 receives the y beam part 112y from the y slit 110y that is located at the end portion in the x direction on the mask 102. In addition, the detection unit 104, for example, at a position xb in the x direction, receives the x beam part 112x from one x slit 110x. Furthermore, the detection unit 104, for example, at a position xc in the x direction, receives the y beam part 112y from the y slit 110y located at the center in the x direction. Similarly, the detection unit 104, for example, at a position xd in the x direction, receives the x beam part 112x from the other x slit 110x and, for example, at a position xe in the x direction, receives the y beam part 112y from the y slit 110y located at the end portion in the x direction.

The detection unit 104 outputs relation between the position in the x direction and the beam current that are acquired as a result of the movement in the x direction to the beam angle calculating unit 108. The beam angle calculating unit 108 specifies the position of the y beam part 112y in the x direction based on the relation between the position in the x direction and the beam current. The beam angle calculating unit 108, for example, determines the position of peak of the beam current in the x direction that corresponds to the y beam part 112y as the position of the y beam part 112y in the x direction.

As illustrated in FIG. 4, the y beam part 112y is incident over several detection elements 114 aligned in the y direction. Thus, in this embodiment, beam currents output from individual detection elements 114 are added together, and the total beam current is used for specifying the position of the y beam part 112y in the x direction.

As is known, an x-direction beam angle θx can be calculated based on the ratio between an x-direction beam displacement amount between first and second positions in the z direction and a distance between the first and second positions in the z direction. Since the mask 102 is maintained at a defined place during detection, the position of each slit on the mask 102 in the z direction and the position of each slit within the xy plane at the z-direction position are known. In addition, the position of the detection unit 104 in the z direction is known. Accordingly, by using these known positional relations and the detected position of the y beam part 112y in the x direction, the x-direction beam angle θx can be calculated.

The width of the y beam part 112y in the x direction, as illustrated in FIG. 3, is made thin in correspondence with the width of the y slit 110y in the x direction. Accordingly, the position of the peak of a beam current that corresponds to the y beam part 112y in the x direction can be easily specified. In addition, the y beam part 112y, as illustrated in FIG. 4, has a large width in the y direction in correspondence with the y slit 110y. Accordingly, a beam current received by the detection unit 104 can be configured to be higher than that of a case where a mask having small circular holes is used as in the conventional case.

Similarly, a y-direction beam angle θy can be calculated based on the ratio between a y-direction beam displacement amount between the first and second positions in the z direction and a distance between the first and second positions in the z direction. As illustrated in FIG. 5, the width of the x beam part 112x in the y direction is made thin in correspondence with the width of the x slit 110x in the y direction. The x beam part 112x arrives at a specific detection element 114 of the detection unit 104, and the position of the detection element 114 in the y direction can be regarded as the position of the x beam part 112x in the y direction. The y-direction beam angle θy can be calculated by using the position of the x beam part 112x in the y direction, which has been detected as above, and the known positional relation between the mask 102 and the detection unit 104. As illustrated in FIG. 3, since the x beam part 112x has a large width in the x direction in correspondence with the x slit 110x, a beam current received by the detection unit 104 can be configured to be high.

As above, according to the first embodiment, by forming the x-direction slits and the y-direction slits in one mask, the x-direction beam angle θx and the y-direction beam angle θy can be measured at the same time by using one mask.

By disposing the plurality of y slits 110y at positions that are different from each other in the x direction, a distribution of x-direction beam angles θx of the ion beam B in the x direction can be acquired. For example, the x-direction beam angle θx acquired from the y beam part 112y located at the center can be used as a representative value of the x-direction beam angle of the ion beam B. In addition, as an index representing the uniformity of the x-direction beam angle θx, for example, a difference between this representative value and the x-direction beam angle θx acquired from the y beam part 112y located at the end portion can be used.

In addition, by disposing the plurality of x slits 110x at positions that are different from each other in the x direction, a distribution of the y-direction beam angles θy of the ion beam B in the x direction can be acquired.

In the above-described embodiment, the detection unit 104 moves in the x direction at a constant speed. In this case, there is an advantage of simplifying the operation of the detection unit 104. However, in an embodiment, in order to increase the amount of the beam current received by the detection unit 104, the detection unit 104 may be configured to adjust the movement speed of the moving detector while the moving detector traverses the measuring ion beam Bm once. For example, the moving detector may reduce the speed or stop so as to receive the x beam part 112x. More specifically, for example, the moving detector may reduce the speed right before the reception of the x beam part 112x and continue the reduced speed until passing through the x beam part 112x. Alternatively, the moving detector may stop for a predetermined time at a position receiving the x beam part 112x.

Second Embodiment

Figure 6:
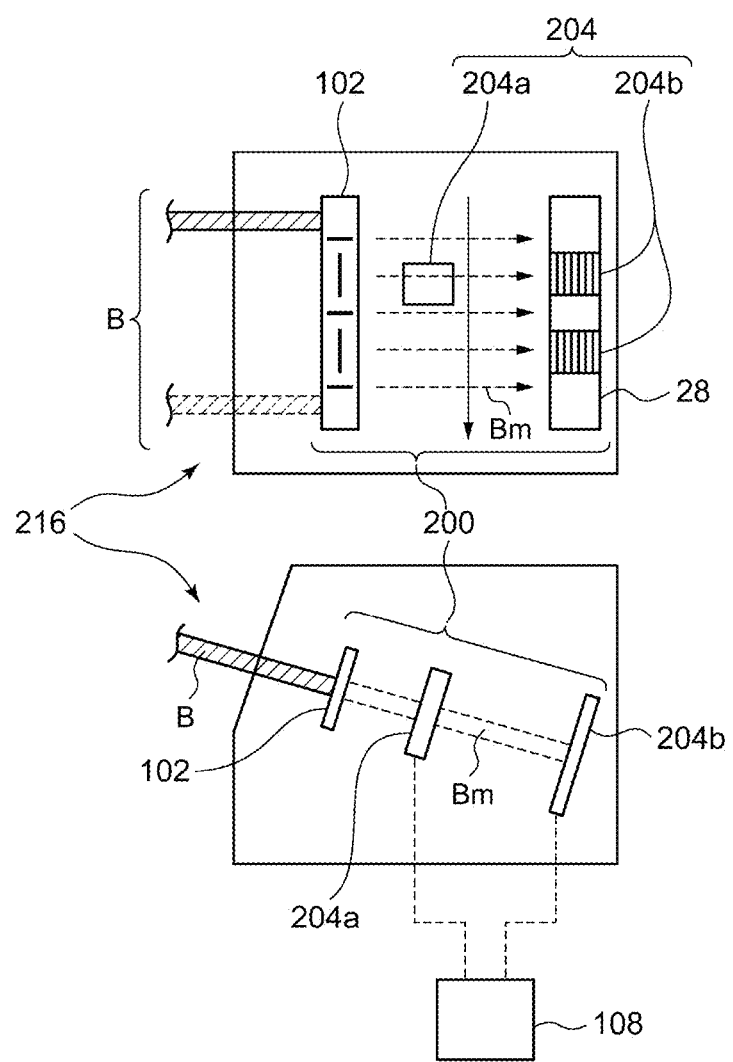
FIG. 6 is a schematic diagram that illustrates a processing chamber of an ion implantation apparatus according to a second embodiment of the present invention.

FIG. 6 is a schematic diagram that illustrates a vacuum processing chamber 216 of an ion implantation apparatus according to a second embodiment of the present invention. An upper part of FIG. 6 is a top view that illustrates a schematic configuration of the vacuum processing chamber 216. A lower part of FIG. 6 is a side view that illustrates a schematic configuration of the vacuum processing chamber 216. The ion implantation apparatus according to the second embodiment may include the ion source 12 and the beamline device 14 illustrated in FIG. 1.

Figure 7:
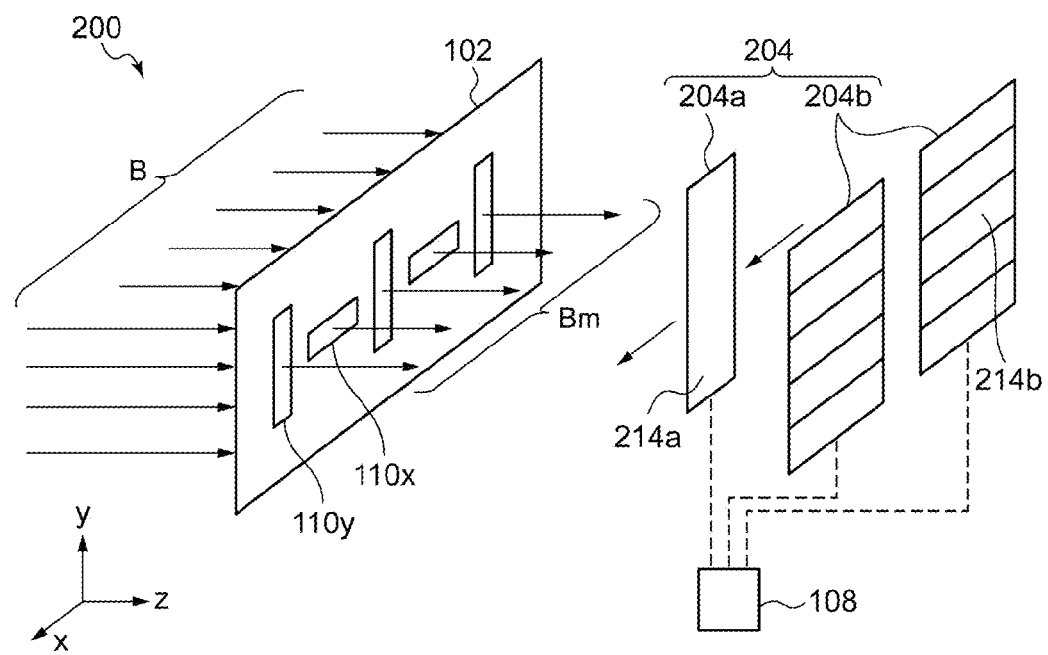
FIG. 7 is a schematic diagram that illustrates an ion beam measuring device according to the second embodiment of the present invention.
Figure 8:
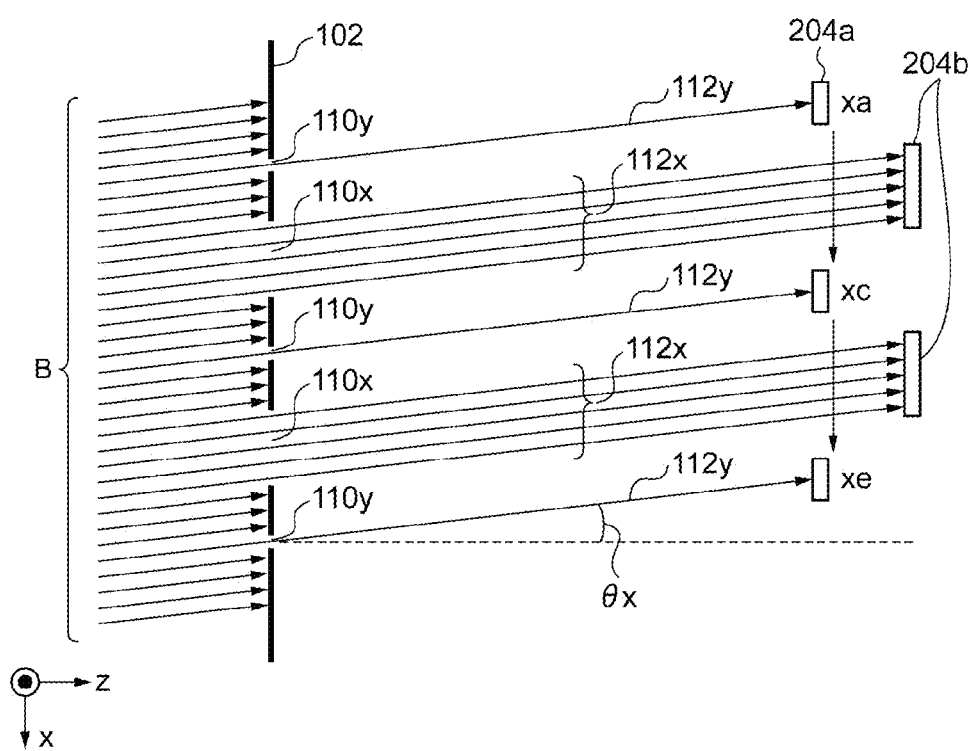
FIG. 8 is a diagram that is acquired when the ion beam measuring device illustrated in FIG. 7 is cut at the center of a mask in the y direction and is viewed in the y direction.

FIG. 7 is a schematic diagram that illustrates anion beam measuring device 200 according to the second embodiment of the present invention. FIG. 8 is a diagram that is acquired when the ion beam measuring device 200 illustrated in FIG. 7 is cut at the center of a mask 102 in the y direction and is viewed in the y direction.

The ion beam measuring device 200 according to the second embodiment has a configuration for detecting the measuring ion beam Bm that is different from that of the ion beam measuring device 100 according to the first embodiment. A mask 102 of the second embodiment is the same as that of the first embodiment.

The ion beam measuring device 200 includes a mask 102 that is used for shaping the original ion beam B into a measuring ion beam Bm and a detection unit 204 that is configured to detect the measuring ion beam Bm. In addition, the ion beam measuring device 200 includes a beam angle calculating unit 108 that is configured to calculate an angle formed by the actual traveling direction of the ion beam B with respect to the z direction that is the designed traveling direction based on the output of the detection unit 204.

The detection unit 204 is configured to detect a position of the y beam part 112y in the x direction and a position of the x beam part 112x in the y direction. The detection unit 204 includes a moving detector 204a that is movable in the x direction so as to traverse the measuring ion beam Bm and a fixed detector 204b that is arranged on the downstream side of the moving detector 204a in the traveling direction of the ion beam.

The moving detector 204a is movable in the x direction so as to traverse the measuring ion beam Bm. In accordance with the movement of the moving detector 204a in the x direction, the position of the y beam part 112y in the x direction is detected. The moving detector 204a includes a moving detection element 214a that is elongated in the y direction to correspond to the y beam part 112y. In an embodiment, the moving detector 204a may be the detection unit 104 according to the first embodiment. In such a case, the moving detector 204a may include a plurality of detection elements arranged in the y direction.

On the other hand, the fixed detector 204b is arranged in the beam stopper 28 so as to receive the x beam part 112x. In other words, the fixed detector 204b is disposed at a place on the beam stopper 28 on which the x beam part 112x is incident. The fixed detector 204b includes a plurality of fixed detection elements 214b arranged in the y direction. In this embodiment, since the measuring ion beam Bm includes two x beam parts 112x, the fixed detector 204b includes two y-direction arrays of fixed detection elements 214b. The position of the x beam part 112x in the y direction is detected based on the arrival position of the x beam part 112x in the fixed detector 204b.

As illustrated in FIG. 8, the moving detector 204a moves in the x direction for detecting the measuring ion beam. Bm. At this time, the moving detector 204a, for example, receives the y beam part 112y from the y slit 110y disposed on the mask 102, which is located at the end portion in the x direction, at a position xa in the x direction. The moving detector 204a passes through the x beam part 112x. In addition, the moving detector 204a, for example, receives the y beam part 112y from the y slit 110y, which is located at the center in the x direction, at a position xc in the x direction. Furthermore, the moving detector 204a passes through the x beam part 112x and, for example, receives the y beam part 112y from the y slit 110y, which is located at the end portion in the x direction, at a position xe in the x direction.

The moving detector 204a outputs relation between the position of the y beam part 112y in the x direction and the beam current, which are acquired during the x-direction movement, to the beam angle calculating unit 108. The beam angle calculating unit 108 specifies the position of the y beam part 112y in the x direction based on the relation. The beam angle calculating unit 108, for example, determines the position of peak of the beam current in the x direction that corresponds to the y beam part 112y as the position of the y beam part 112y in the x direction. The beam angle calculating unit 108 calculates an x-direction beam angle θx by using the acquired position of the y beam part 112y in the x direction and the known positional relation between the mask 102 and the moving detector 204a.

On the other hand, when the moving detector 204a is separate away from the x beam part 112x, the fixed detector 204b detects the position of the x beam part 112x in the y direction. When a corresponding x beam part 112x is not blocked by the moving detector 204a, the fixed detector 204b receives the x beam part 112x. The x beam part 112x arrives at a specific fixed detection element 214b of the fixed detector 204b. Accordingly, the position of the fixed detection element 214b in the y direction may be regarded as the position of the x beam part 112x in the y direction. The beam angle calculating unit 108 calculates a y-direction beam angle θy by using the position of the x beam part 112x in the y direction, which has been detected in such a way, and the known positional relation between the mask 102 and the fixed detector 204b.

In this way, the detection unit 204 can detect the position of the y beam part 112y in the x direction and the position of the x beam part 112x in the y direction while the moving detector 204a traverses the measuring ion beam Bm once.

According to the second embodiment, similar to the first embodiment, the beam current received by the detection unit 204 can be configured to be high because of a slit having a large width. In addition, by forming x-direction slits and the y-direction slits in one mask, the x-direction beam angle and the y-direction beam angle can be measured at the same time by using one mask.

In most of the existing ion implantation apparatuses, detectors corresponding to the moving detector 204a and the fixed detector 204b are disposed. Thus, according to the second embodiment, there is an advantage that the ion beam measuring device 200 can be configured by applying such existing detectors.

In addition, in an embodiment, the x-direction beam angle and the y-direction beam angle do not need to be measured at the same time. For example, after the x-direction beam angle θx is measured by the moving detector 204a, the moving detector 204a is retreated, and the y-direction beam angle can be measured by the fixed detector 204b.

In addition, instead of arranging the mask 102 on the upstream side from the substrate W, the mask 102 may be arranged at a position in the z direction at which the substrate W should be placed. In such a case, the moving detector 204a may be arranged on the downstream side from the position in the z direction at which the substrate W should be placed.

Third Embodiment

Figure 9:
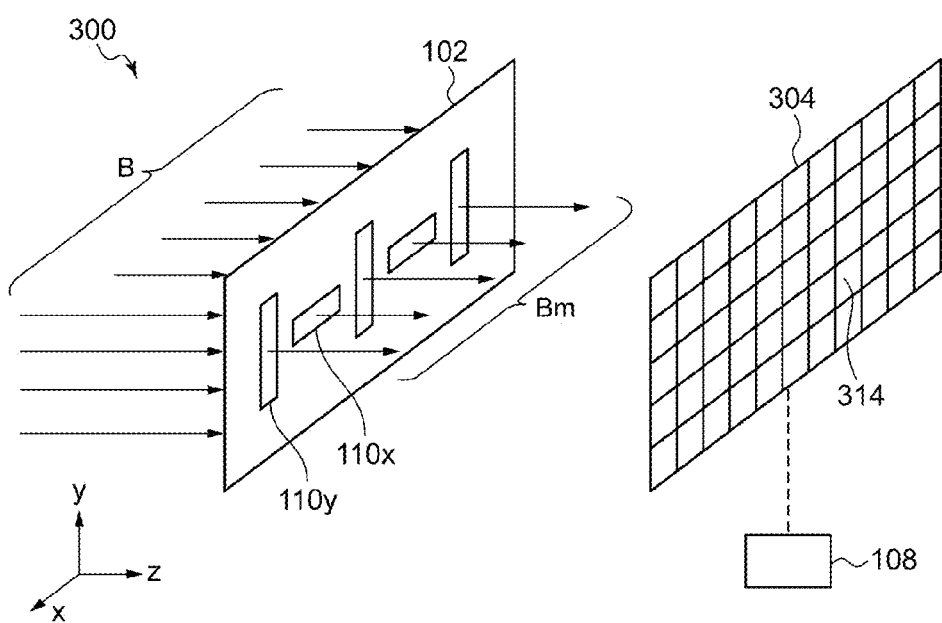
FIG. 9 is a schematic diagram that illustrates an ion beam measuring device according to a third embodiment of the present invention.

FIG. 9 is a schematic diagram that illustrates an ion beam measuring device 300 according to a third embodiment of the present invention. The ion beam measuring device 300 according to the third embodiment has a configuration for detecting the measuring ion beam Bm that is different from those of the ion beam measuring devices according to the first and second embodiments. A mask 102 of the third embodiment is the same as that of the above-described embodiment.

The ion beam measuring device 300 includes a mask 102 that is used for shaping an original ion beam B into a measuring ion beam Bm and a detection unit 304 that is configured to detect the measuring ion beam Bm. In addition, the ion beam measuring device 300 includes a beam angle calculating unit 108 that is configured to calculate an angle formed by the actual traveling direction of the ion beam B with respect to the z direction that is the designed traveling direction based on the output of the detection unit 304.

The detection unit 304 is configured to detect the position of a y beam part of the measuring ion beam Bm in the x direction and detect the position of an x beam part of the measuring ion beam Bm in the y direction. The detection unit 304 includes a fixed detector that is arranged so as to receive the measuring ion beam Bm. The fixed detector includes a two-dimensional array of detection elements 314. The detection elements 314 are arranged in a matrix pattern along the x direction and the y direction.

The position of the y beam part in the x direction is detected based on the arrival position of the y beam part in the detection unit 304. The y beam part arrives at several detection elements 314 aligned in the y direction at an x-direction position on the detection unit 304, and the x-direction position of the detection elements 314 can be regarded as the position of the y beam part in the x direction. Beam currents output from individual detection elements 314 are added together, and the total beam current is used for specifying the position of the y beam part in the x direction. By using the detected position of the y beam part in the x direction and the known positional relation between the mask 102 and the detection unit 304, an x-direction beam angle θx is calculated.

Similarly, the position of the x beam part in the y direction is detected based on the arrival position of the x beam part in the detection unit 304. The x beam part arrives at several detection elements 314 aligned in the x direction at a y-direction position on the detection unit 304, and the y-direction position of the detection elements 314 may be regarded as the position of the x beam part in the y direction. By using the detected position of the x beam part in the y direction and the known positional relation between the mask 102 and the detection unit 304, a y-direction beam angle θy is calculated.

In this way, according to the third embodiment, similar to the above-described embodiments, the beam current received by the detection unit 304 can be configured to be high because of a slit having a large width. In addition, by forming x-direction slits and the y-direction slits in one mask, the x-direction beam angle and the y-direction beam angle can be measured at the same time by using one mask.

In the third embodiment, the mask 102 is stopped while detection is performed by the detection unit 304. However, in an embodiment, for example, the mask 102 may be moved in the x direction while detection is performed by the detection unit 304. Also in such a case, the beam angle can be measured.

In an embodiment, the detection unit 304 may include a fixed detector having a two-dimensional array of detection elements 314 and the moving detector according to the above-described embodiment. In such a case, the fixed detector is arranged on the downstream side of the moving detector in the z direction.

Fourth Embodiment

Figure 10:
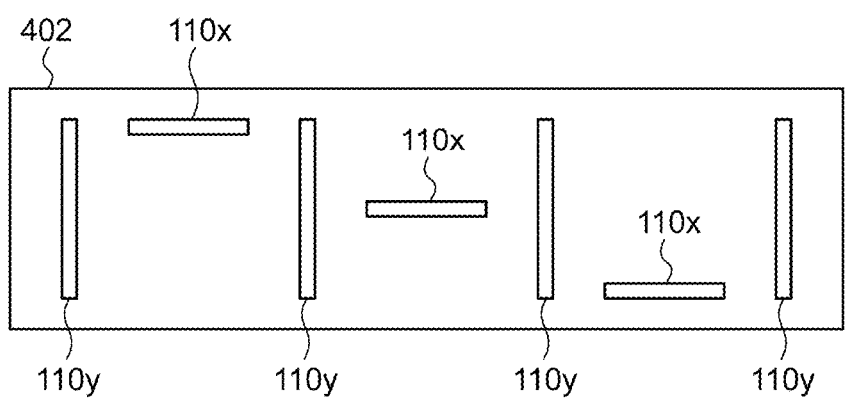
FIG. 10 is a diagram that illustrates a mask used in an ion beam measuring device according to a fourth embodiment of the present invention.

FIG. 10 is a diagram that illustrates a mask 402 used in an ion beam measuring device according to a fourth embodiment of the present invention. In the mask 402 according to the fourth embodiment, particularly, the position of the x slit 110x in the y direction is different from that of the mask 102 according to the above-described embodiment. In FIG. 10, the y direction is the vertical direction, and the x direction is the horizontal direction.

The mask 402 illustrated in FIG. 10 includes four first mask parts and three second mask parts in an irradiated region on the mask 402 on which the original ion beam B is incident. Such first mask parts and second mask parts are alternately arranged in the x direction. Each first mask part includes one y slit 110y, and each second mask part includes one x slit 110x. Accordingly, the mask 402 includes four y slits 110y and three x slits 110x, and the y slits 110y and the x slits 110x are alternately arranged in the x direction.

Out of the three x slits, the center x slit 110x is located at the center of the irradiated region on the mask 402 in the x direction and the y direction on which the ion beam B is incident. Each one of the remaining two x slits 110x is arranged at a y-direction position different from that of the x slit 110x located at the center in the irradiated region on the mask 402. These remaining two x slits 110x have mutually different positions in the y direction. In the mask 402 illustrated in the figure, while gaps between the x slits 110x, which are adjacent to each other, in the y direction are the same, the gaps do not need to be the same.

As above, by disposing the plurality of x slits 110x at positions that are different from each other in the y direction, a distribution of y-direction beam angles θy of the ion beam B in the y direction can be acquired.

The mask 402 according to the fourth embodiment may be used in combination with the configuration used for detecting the measuring ion beam Bm according to any one of the above-described embodiments. Accordingly, an ion beam measuring device according to an embodiment may include a mask 402 including a plurality of x slits 110x formed at positions that are different from each other in the y direction and a detection unit 104 that is a moving detector. In addition, an ion beam measuring device according to an embodiment may include a mask 402 including a plurality of x slits 110x formed at positions different from each other in the y direction and a detection unit 204 that includes a moving detector 204a and a fixed detector 204b. An ion beam measuring device according to an embodiment may include a mask 402 that includes a plurality of x slits 110x formed at positions different from each other in the y direction and a detection unit 304 that is a fixed detector.

Fifth Embodiment

Figure 11:
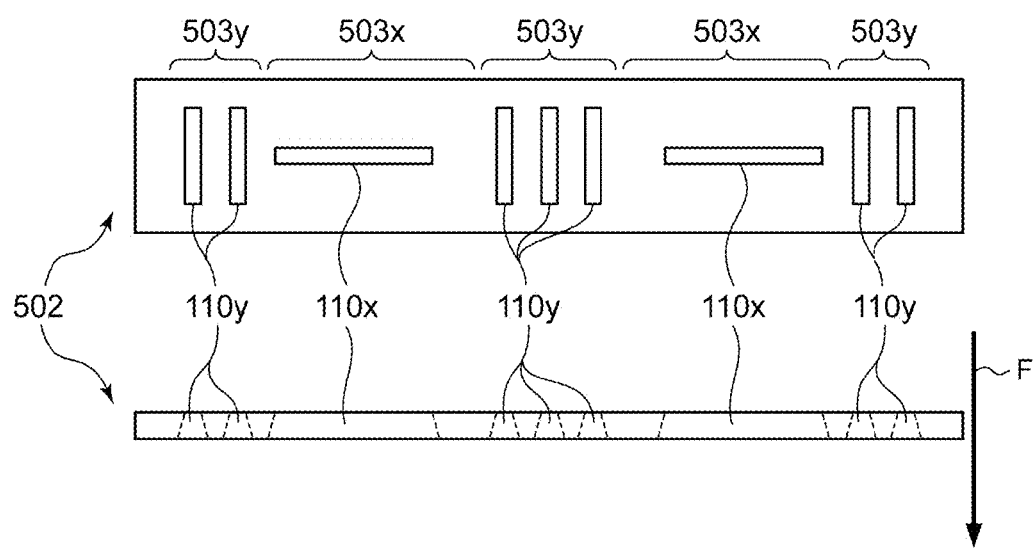
FIG. 11 is a diagram that illustrates a mask used in an ion beam measuring device according to a fifth embodiment of the present invention.

FIG. 11 is a diagram that illustrates a mask 502 used in an ion beam measuring device according to a fifth embodiment of the present invention. An upper part of FIG. 11 is a front view of the mask 502, and a lower part of FIG. 11 is a side view of the mask 502. In the mask 502 according to the fifth embodiment, the arrangement of slits is different from that of the mask of the above-described embodiment. In the upper part of FIG. 11, the y direction is the vertical direction, and the x direction is the horizontal direction. For the convenience of description, in the lower part of FIG. 11, the traveling direction of an ion beam is denoted by the arrow F.

The mask 502 illustrated in FIG. 11 includes three first mask parts 503y and two second mask parts 503x in an irradiated region on the mask 502 on which the original ion beam B is incident. Such first mask parts 503y and second mask parts 503x are alternately arranged in the x direction. The first mask part 503y disposed at the center includes three y slits 110y, and each one of the first mask parts 503y located at both ends includes two y slits 110y. The y slits 110y of each first mask part 503y are arranged in the x direction in parallel with each other. In addition, each second mask part 503x includes one x slit 110x.

Accordingly, the mask 502 includes a total of seven y slits 110y and two x slits 110x. The three y slits 110y disposed at the center are arranged at the center of the irradiated region on the mask 502 in the x direction on which the ion beam B is incident. The two y slits 110y disposed at each end are arranged at the end portions of the irradiated region on the mask 502 in the x direction. Meanwhile, the two x slits 110x are located at the same position in the y direction and are arranged at the center of the irradiated region on the mask 102 in the y direction.

An ion beam is irradiated to the first mask part 503y and passes through the y slit 110y, whereby a y beam part is generated. In addition, an ion beam is irradiated to the second mask part 503x and passes through the x slit 110x, whereby an x beam part is generated. Corresponding to the arrangement of the y slits 110y and the x slits 110x on the mask 502, a measuring ion beam including seven y beam parts and two x beam parts is generated.

As illustrated in the lower part of FIG. 11, the widths of the y slit 110y and the x slit 110x in the x direction (in the horizontal direction in the figure) broaden from the upstream side to the downstream side in the traveling direction of the ion beam so as to form a taper shape. The degree of broadening is determined depending on the divergence angle of the ion beam. Such a slit shape is helpful for detecting all the angular components of a beam part passing through the slit. Although not illustrated in the figure, similarly, the widths of the y slit 110y and the x slit 110x in the y direction may broaden from the upstream side to the downstream side in the traveling direction of the ion beam so as to form a taper shape.

In an embodiment, the ion beam measuring device may compare profiles acquired by observing beam parts passing through a plurality of slits (for example, the y slits 110y) that are adjacently arranged in parallel with each other using a detector with another and evaluate the similarity thereof. The ion beam measuring device may determine whether measurement is normally performed based on the evaluation result. During the measurement, for example, in a case where an abnormality such as a discharge occurs, two beam current profiles derived from two parallel slits adjacent to each other may have mutually-different shapes.

Thus, in a case where the beam current profiles corresponding to the slits are evaluated to be similar to each other, the ion beam measuring device may determine that the measurement is normally performed. To the contrary, in a case where the beam current profiles corresponding to the slits are evaluated not to be similar to each other, the ion beam measuring device may determine that measurement is not normally performed. In a case where it is determined that measurement is not normally performed, the ion beam measuring device may perform remeasurement.

In addition, similar to the above-described mask 102, in the mask 502, a gap between two adjacent slits is determined such that two adjacent beam parts of the measuring ion beam corresponding to the adjacent slits are separate from each other when the measuring ion beam is incident on the detection unit. For example, the slit gap is determined in accordance with a distance between the mask 502 and the detection unit. The slit gap is configured to be large in a case where the distance between the slit and the detector is long and is configured to be small in a case where the distance is short. As the slit gap becomes smaller, more slits can be arranged in the mask 502.

The mask 502 according to the fifth embodiment may be used in combination with the configuration used for detecting the measuring ion beam Bm according to any one of the above-described embodiments. Accordingly, an ion beam measuring device according to an embodiment may include a mask 502 that includes a plurality of first mask parts 503y each including a plurality of y slits 110y and a detection unit 104 that is a moving detector. In addition, an ion beam measuring device according to an embodiment may include a mask 502 that includes a plurality of first mask parts 503y each including a plurality of y slits 110y and a detection unit 204 that includes the moving detector 204a and the fixed detector 204b. Furthermore, an ion beam measuring device according to an embodiment may include a mask 502 that includes a plurality of first mask parts 503y each including a plurality of y slits 110y and a detection unit 304 that is a fixed detector.

Figure 12:
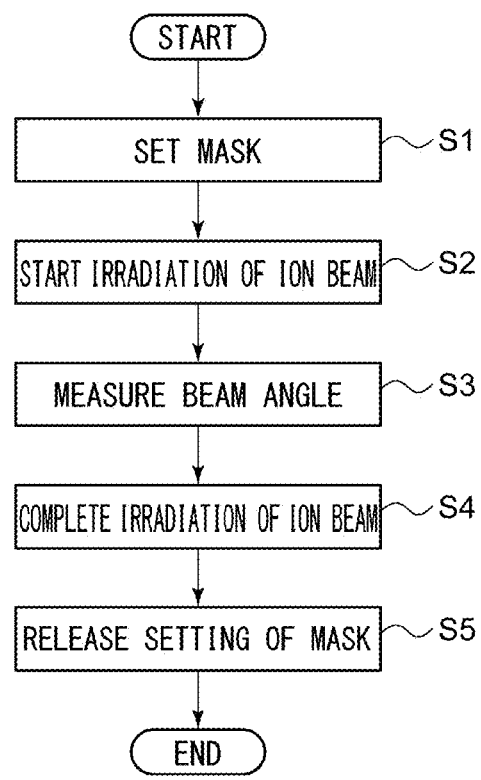
FIG. 12 is a flowchart for describing a method of measuring an ion beam according to an embodiment of the present invention.

FIG. 12 is a flowchart for describing a method of measuring an ion beam according to an embodiment of the present invention. First, a mask is set at a position through which an ion beam passes in Step S1. This operation is mechanically performed. In the mask, y slits and x slits are disposed as described above. Thereafter, until the process of this method ends, the mask is maintained at the position, and the mask is stopped during the measurement.

Next, the irradiation of the ion beam starts in Step S2. The ion beam passes through slits of the mask, whereby a measuring ion beam is prepared. The measuring ion beam, as described above, includes a y beam part elongated in the y direction that is perpendicular to the traveling direction of the ion beam and an x beam part elongated in the x direction that is perpendicular to the traveling direction and the y direction.

Subsequently, the beam angle is measured in Step S3. An arrival position of the ion beam that has passed through the mask is measured by using the detection unit. The position of the y beam part in the x direction is detected, and the position of the x beam part in the y direction is detected. At this time, the detection unit is moved with respect to the measuring ion beam as is necessary. An x-direction beam angle is calculated using the detected x-direction position, and a y-direction beam angle is calculated using the detected y-direction position. Thereafter, the irradiation of the ion beam ends in Step S4, and finally, the set of mask is released in Step S5. The mask is returned to the retreat position. In this way, the process of this method ends.

Several representative embodiments of the present invention have been described. According to the embodiments of the present invention, by forming the x-direction slits and the y-direction slits in one mask, the x-direction beam angle $\theta x$ and the y-direction beam angle $\theta y$ can be measured at the same time by using one mask.

Generally, the beam angle of the ion beam B is characterized by angular components of two directions, typically, the x-direction beam angle and the y-direction beam angle. According to the representative embodiments of the present invention, the x-direction beam angle $\theta x$ and the y-direction beam angle $\theta y$ can be directly acquired by using the x-direction position of the y beam part 112y and the y-direction position of the x beam part 112x.

Therefore, according to the representative embodiments of the present invention, the beam angles of two directions can be measured by employing a simple configuration.

Described above is an explanation based on the exemplary embodiments of the present invention. The invention is not limited to the above-mentioned embodiments, and various design modifications may be added. It will be obvious to those skilled in the art that such modifications are also within the scope of the present invention.

In the above-described embodiments, the y beam part 112y has an elongated beam cross-section that is continuous in the y direction. However, in this specification, the y beam part may include a small beam cross-section that is not continuous in the y direction. In an embodiment, the y beam part may include a plurality of small beam parts arranged in the y direction. Such small beam parts are arranged so as to have a function that is the same as or similar to that of the beam cross-section that is continuous in the y direction. In this way, the y beam part elongated in the y direction may be formed collectively by a plurality of small beam parts. This applies the same to the x beam part.

Accordingly, the slit of the mask is not limited to a single elongated opening. In an embodiment, the mask may include a plurality of small openings, and each small opening may generate a corresponding small beam part. Accordingly, the mask may include an array of small openings forming y slits and x slits as a whole. For example, the mask may include a plurality of small holes arranged in the y direction similar to the y slits 110y and a plurality of small holes arranged in the x direction similar to the x slits 110x.

An ion implantation apparatus according to an embodiment is configured to use an ion beam scanned in the x direction or an ion beam having a x-direction diameter larger than a y-direction diameter of the ion beam and to provide mechanical scan of a wafer in the y direction. Here, the traveling direction of the ion beam is the z direction, and two directions perpendicular to each other on a plane that is perpendicular to the z direction are the x and y directions. In addition, the ion implantation apparatus includes an ion beam angle measuring mechanism that is configured to measure beam angles in the x direction and the y direction. The measuring mechanism includes a detection unit allowing a part of the ion beam to pass through a mask that is set at a predetermined position with an orientation perpendicular to the z direction and detecting the arrival position of a passed beam on the downstream side of the z direction when the beam angles in the x direction and the y direction are measured. This detection unit can measure the distribution of arrival position of passed beam. In addition, the measuring mechanism includes a unit that calculates the angle of a passed beam based on the detected distribution of arrival position. In the mask, at least one slit elongated in the y direction and at least one slit elongated in the x direction for passing a part of the ion beam are provided. The measuring mechanism measures the beam angle in the x direction and the beam angle in the y direction at the same time.

The detection unit for a passed beam may be configured by a plurality of detectors arranged in the y direction, and the measuring mechanism may measure an ion beam while moving the plurality of detectors in the x direction. The measuring mechanism may reduce the speed of the plurality of detectors or stop the plurality of detectors for a predetermined time and measure the y-direction angle when the plurality of detectors are located at the front face of the slit elongated in the x direction.

The detection unit used for measurement with moving may include a moving detector elongated in the y direction and a fixed detector that is arranged at a position located farther than the moving line of the moving detector in the z direction when viewed from the mask. The fixed detector may include a plurality of detection elements arranged in the y direction at the front face of a slit, which is elongated in the x direction, of the mask. The measuring mechanism may detect the arrival position of the beam using the fixed detector only when the moving detector elongated in the y direction is not located at the front face of the slit elongated in the x direction.

The detection unit may be configured by fixed detectors that are two-dimensionally arranged.

An ion implantation apparatus according to an embodiment is configured to use an ion beam scanned in the x direction or an ion beam having a x-direction diameter larger than a y-direction diameter of the ion beam and to provide mechanical scan of a wafer in the y direction. Here, the traveling direction of the ion beam is the z direction, and two directions perpendicular to each other on a plane that is perpendicular to the z direction are the x and y directions. In addition, the ion implantation apparatus includes an ion beam angle measuring mechanism that is configured to measure beam angles in the x direction and the y direction. The measuring mechanism includes a detection unit allowing a part of the ion beam to pass through a mask that is set at a predetermined position with an orientation perpendicular to the z direction and detecting the arrival position of a passed beam on the downstream side of the z direction when the beam angles in the x direction and the y direction are measured. This detection unit can measure the distribution of arrival position of passed beam. In addition, the measuring mechanism includes a unit that calculates the angle of a passed beam based on the detected distribution of arrival position. In the mask, at least one slit elongated in the y direction and at least one slit elongated in the x direction for passing a part of the ion beam are provided. The detection unit for a passed beam is configured by a plurality of detectors arranged in the y direction, and the measuring mechanism measures an ion beam while moving the plurality of detectors in the x direction. The detection unit used for measurement with moving includes a moving detector elongated in the y direction and a fixed detector that is arranged at a position located farther than the moving line of the moving detector in the z direction when viewed from the mask. The fixed detector includes a plurality of detection elements arranged in the y direction at the front face of a slit, which is elongated in the x direction, of the mask. The measuring mechanism measures the beam angle in the x direction while moving the detector elongated in the y direction in the x direction and measures the beam angle in the y direction while stopping the detector elongated in the y direction at a position other than the front face of the slit elongated in the x direction.

An ion implantation apparatus according to an embodiment is configured to use an ion beam scanned in the x direction or an ion beam having a x-direction diameter larger than a y-direction diameter of the ion beam and to provide mechanical scan of a wafer in the y direction. Here, the traveling direction of the ion beam is the z direction, and two directions perpendicular to each other on a plane that is perpendicular to the z direction are the x and y directions. In addition, the ion implantation apparatus includes an ion beam angle measuring mechanism that is configured to measure beam angles in the x direction and the y direction. The measuring mechanism includes a detection unit allowing a part of the ion beam to pass through a mask that is set at a predetermined position with an orientation perpendicular to the z direction and detecting the arrival position of a passed beam on the downstream side of the z direction when the beam angles in the x direction and the y direction are measured. This detection unit can measure the distribution of arrival position of passed beam. In addition, the measuring mechanism includes a unit that calculates the angle of a passed beam based on the detected distribution of arrival position. In the mask, at least one slit elongated in the y direction and a plurality of slits elongated in the x direction for passing a part of the ion beam are provided. The plurality of slits elongated in the x direction are arranged such that the y-direction positions on the mask are different from one another. The measuring mechanism measures the beam angle in the x direction and the beam angle in the y direction at the same time.

The detection unit for a passed beam may be configured by a plurality of detectors arranged in the y direction, and the measuring mechanism may measure an ion beam while moving the plurality of detectors in the x direction. The measuring mechanism may reduce the speed of the plurality of detectors or stop the plurality of detectors for a predetermined time and measure the y-direction angle when the plurality of detectors are located at the front face of the slit elongated in the x direction.

The detection unit used for measurement with moving may include a moving detector elongated in the y direction and a fixed detector that is arranged at a position located farther than the moving line of the moving detector in the z direction when viewed from the mask. The fixed detector may include a plurality of detection elements arranged in the y direction at the front face of a slit, which is elongated in the x direction, of the mask. The measuring mechanism may detect the arrival position of the beam using the fixed detector only when the moving detector elongated in the y direction is not located at the front face of the slit elongated in the x direction.

The detection unit may be configured by fixed detectors that are two-dimensionally arranged.

An ion implantation apparatus according to an embodiment is configured to use an ion beam scanned in the x direction or an ion beam having a x-direction diameter larger than a y-direction diameter of the ion beam and to provide mechanical scan of a wafer in the y direction. Here, the traveling direction of the ion beam is the z direction, and two directions perpendicular to each other on a plane that is perpendicular to the z direction are the x and y directions. In addition, the ion implantation apparatus includes an ion beam angle measuring mechanism that is configured to measure beam angles in the x direction and the y direction. The measuring mechanism includes a detection unit allowing a part of the ion beam to pass through a mask that is set at a predetermined position with an orientation perpendicular to the z direction and detecting the arrival position of a passed beam on the downstream side of the z direction when the beam angles in the x direction and the y direction are measured. This detection unit can measure the distribution of arrival position of passed beam. In addition, the measuring mechanism includes a unit that calculates the angle of a passed beam based on the detected distribution of arrival position. In the mask, at least one slit elongated in the y direction and a plurality of slits elongated in the x direction for passing a part of the ion beam are provided. The plurality of slits elongated in the x direction are arranged such that the y-direction positions on the mask are different from one another. The detection unit for a passed beam is configured by a plurality of detectors arranged in the y direction, and the measuring mechanism measures an ion beam while moving the plurality of detectors in the x direction. The detection unit used for measurement with moving includes a moving detector elongated in the y direction and a fixed detector that is arranged at a position located farther than the moving line of the moving detector in the z direction when viewed from the mask. The fixed detector includes a plurality of detection elements arranged in the y direction at the front face of a slit, which is elongated in the x direction, of the mask. The measuring mechanism measures the beam angle in the x direction while moving the detector elongated in the y direction in the x direction and measures the beam angle in the y direction while stopping the detector elongated in the y direction at a position other than the front face of the slit elongated in the x direction.

Hereinafter, several embodiments of the present invention will be described.

1. An ion beam measuring device including:

a mask that is used for shaping an original ion beam into a measuring ion beam including a y beam part elongated in a y direction that is perpendicular to an ion beam traveling direction and an x beam part elongated in an x direction that is perpendicular to the traveling direction and the y direction;

a detection unit that is configured to detect an x-direction position of the y beam part and a y-direction position of the x beam part; and a beam angle calculating unit that is configured to calculate an x-direction beam angle using the x-direction position and a y-direction beam angle using the y-direction position.

2. The ion beam measuring device according to Embodiment 1, wherein the original ion beam is an ion beam scanned over a scanning range that is in the x direction and has a width in the x direction longer than a width in the y direction or an ion beam that has a width in the x direction longer than a width in the y direction, wherein the mask includes a plurality of first mask parts and a plurality of second mask parts in an irradiated region on the mask on which the original ion beam is incident, wherein each of the plurality of first mask parts includes at least one y slit that corresponds to the y beam part, wherein each of the plurality of second mask parts includes at least one x slit that corresponds to the x beam part, and wherein the plurality of first mask parts and the plurality of second mask parts are alternately arranged in the x direction.

3. The ion beam measuring device according to Embodiment 2, wherein the plurality of first mask parts include a center first mask part that is arranged at the center of the irradiated region in the x direction and an end first mask part that is arranged at an end portion of the irradiated region in the x direction.

4. The ion beam measuring device according to Embodiment 2 or 3, wherein at least one of the plurality of first mask parts includes a plurality of y slits that are arranged in the x direction.

5. The ion beam measuring device according to any one of Embodiments 2 to 4, wherein the plurality of second mask parts include one of the second mask parts including an x slit at a y position and another one of the second mask parts including an x slit at a different y position.

6. The ion beam measuring device according to any one of Embodiments 2 to 5, wherein a width of the y slit and/or a x slit broadens from an upstream side to a downstream side in the ion beam traveling direction.

7. The ion beam measuring device according to any one of Embodiments 1 to 6, wherein, in the mask, a gap between two adjacent slits is determined such that two adjacent beam parts of the measuring ion beam corresponding to the adjacent slits are separate from each other when the measuring ion beam is incident on the detection unit.

8. The ion beam measuring device according to any one of Embodiments 1 to 7, wherein the mask is stopped while detection is performed by the detection unit.

9. The ion beam measuring device according to any one of Embodiments 1 to 8, wherein the detection unit includes a moving detector that is movable at least in the x direction so as to traverse the measuring ion beam, and the moving detector detects at least the x-direction position of the y beam part.

10. The ion beam measuring device according to Embodiment 9, wherein the moving detector includes a detection element that is elongated in the y direction to conform the y beam part.

11. The ion beam measuring device according to Embodiment 9 or 10, wherein the detection unit includes a fixed detector that is arranged so as to receive at least the x beam part, and wherein the fixed detector includes a plurality of detection elements arranged at least in the y direction and detects the y-direction position of the x beam part.

12. The ion beam measuring device according to Embodiment 11, wherein the fixed detector is located downstream of the moving detector in the ion beam traveling direction.

13. The ion beam measuring device according to Embodiment 12, wherein the fixed detector detects the y-direction position of the x beam part when the moving detector is in a position away from the x beam part.

14. The ion beam measuring device according to Embodiment 9, wherein the moving detector includes a plurality of detection elements arranged at least in the y direction and detects also the y-direction position of the x beam part.

15. The ion beam measuring device according to any one of Embodiments 9 to 14, wherein the moving detector reduces speed or stops so as to receive the x beam part.

16. The ion beam measuring device according to any one of Embodiments 9 to 15, wherein the detection unit is configured to detect the x-direction position of the y beam part and the y-direction position of the x beam part while the moving detector traverses the measuring ion beam once.

17. The ion beam measuring device according to any one of Embodiments 1 to 8,
wherein the detection unit includes a fixed detector that is arranged so as to receive the measuring ion beam, and
wherein the fixed detector includes a two-dimensional array of detection elements and detects the x-direction position of the y beam part and the y-direction position of the x beam part.

18. An ion implantation apparatus including: the ion beam measuring device according to any one of Embodiments 1 to 17.

19. The ion implantation apparatus according to Embodiment 18, wherein the ion beam measuring device is provided with a processing chamber that is used for performing an ion implantation process on a workpiece.

20. A method of measuring an ion beam including:
preparing a measuring ion beam that includes a y beam part elongated in a y direction that is perpendicular to an ion beam traveling direction and an x beam part elongated in an x direction that is perpendicular to the traveling direction and the y direction;
detecting an x-direction position of the y beam part;
detecting a y-direction position of the x beam part;
calculating an x-direction beam angle using the x-direction position; and
calculating a y-direction beam angle using the y-direction position.

It should be understood that the invention is not limited to the above-described embodiment, but may be modified into various forms on the basis of the spirit of the invention. Additionally, the modifications are included in the scope of the invention.

Priority is claimed to Japanese Patent Application No. 2013-134052, filed on Jun. 26, 2013, the entire content of which is incorporated herein by reference.

What is claimed is:

1. An ion beam measuring device comprising:
a mask comprising a single plate-shaped member defining an xy plane that is perpendicular to an ion beam traveling direction, the single plate-shaped member comprising a plurality of apertures configured to shape an original ion beam into a measuring ion beam comprising at least one first y beam part and at least one second y beam part each elongated in a y direction that is perpendicular to the ion beam traveling direction and at least one x beam part elongated in an x direction that is perpendicular to the ion beam traveling direction and the y direction, the plurality of apertures including at least one first y slit and at least one second y slit elongated in the y direction and shaping the at least one first y beam part and the at least one second y beam part, respectively, and at least one x slit elongated in the x direction and shaping the at least one x beam part, the at least one first and second y slits and the at least one x slit formed in the xy plane of the single plate-shaped member, the mask located at a retreat position away from the original ion beam during ion implantation onto a substrate and located at a measurement position to generate the measuring ion beam;
a detection unit configured to detect x-direction positions of the first and second y beam parts and a y-direction position of the at least one x beam part, the detection unit comprising a moving detector arranged downstream of the mask in the ion beam traveling direction and that is movable in at least the x direction so as to traverse the measuring ion beam, the moving detector configured to detect the x-direction positions of the at least one first and second y beam parts, and a fixed detector arranged downstream of the moving detector in the ion beam traveling direction, the fixed detector comprising an array of detection elements arranged in the y direction and configured to detect the y-direction position of the at least one x beam part based on a y-direction position at which the at least one x beam part arrives on the array of detection elements; and
a beam angle calculating unit that is configured to calculate an x-direction beam angle using the x-direction positions and a y-direction beam angle using the y-direction position, wherein
the original ion beam is a scanned ion beam scanned over a scanning range extending in the x direction,
the at least one first y slit is located at a first end part of an irradiated region of the single plate-shaped member on which the scanned ion beam is incident, the at least one second y slit is located at a second opposite end part of the irradiated region, and the at least one x slit is located between the at least one first y slit and the at least one second y slit,
the at least one first y slit, the at least one second y slit, and the at least one x slit are arranged along the x direction within the irradiated region of the single plate-shaped member.

2. The ion beam measuring device according to claim 1, wherein the mask comprises a plurality of first mask parts and a plurality of second mask parts in the irradiated region on the mask on which the original ion beam is incident,
wherein each of the plurality of first mask parts comprises the at least one first y slit or the at least one second y slit that corresponds to the at least one first y beam part or the at least one second y beam part, respectively,
wherein each of the plurality of second mask parts comprises the at least one x slit that corresponds to the at least one x beam part, and
wherein the plurality of first mask parts and the plurality of second mask parts are alternately arranged in the x direction.

3. The ion beam measuring device according to claim 2, wherein the plurality of first mask parts comprise a center first mask part that is arranged at the center of the irradiated region in the x direction and an end first mask part that is arranged at an end portion of the irradiated region in the x direction.

4. The ion beam measuring device according to claim 2, wherein at least one of the plurality of first mask parts comprises the plurality of first and second y slits that are arranged in the x direction.

5. The ion beam measuring device according to claim 2, wherein
the at least one x slit is a plurality of x slits, and
the plurality of second mask parts comprise one of the second mask parts comprising one x slit at a y position and another one of the second mask parts comprising another x slit at a different y position.

6. The ion beam measuring device according to claim 2, wherein a width of the at least one first y slit or at least one second y slit, and/or at least one x slit broadens from an upstream side to a downstream side in the ion beam traveling direction.

7. The ion beam measuring device according to claim 1, wherein, in the mask, a gap between two adjacent slits is determined such that two adjacent beam parts of the measuring ion beam corresponding to the adjacent slits are separate from each other when the measuring ion beam is incident on the detection unit.

8. The ion beam measuring device according to claim 1, wherein the mask is stopped while detection is performed by the detection unit.

9. The ion beam measuring device according to claim 1, wherein the moving detector comprises a detection element that is elongated in the y direction to conform the at least one first and second y beam parts.

10. The ion beam measuring device according to claim 1, wherein the fixed detector detects the y-direction position of the at least one x beam part when the moving detector is in a position away from the at least one x beam part.

11. The ion beam measuring device according to claim 1, wherein the moving detector comprises a plurality of detection elements arranged at least in the y direction and detects also the y-direction position of the at least one x beam part.

12. The ion beam measuring device according to claim 1, wherein the moving detector reduces speed or stops so as to receive the at least one x beam part.

13. The ion beam measuring device according to claim 1, wherein the detection unit is configured to detect the x-direction position of the at least one first and/or second y beam part and the y-direction position of the at least one x beam part while the moving detector traverses the measuring ion beam once.

14. The ion beam measuring device according to claim 1, wherein the detection unit comprises a fixed detector that is arranged so as to receive the measuring ion beam, and
wherein the fixed detector comprises a two-dimensional array of detection elements and detects the x-direction position of the at least one first or second y beam part and the y-direction position of the at least one x beam part.

15. An ion implantation apparatus comprising:
the ion beam measuring device according to claim 1.

16. The ion implantation apparatus according to claim 15, wherein the ion beam measuring device is provided with a processing chamber that is used for performing an ion implantation process on a workpiece.

17. A method of measuring an ion beam comprising:
moving a mask comprising a single plate-shaped member defining an xy plane that is perpendicular to an ion beam traveling direction, the single plate-shaped member comprising a plurality of apertures including at least one first y slit and at least one second y slit each elongated in a y direction that is perpendicular to the ion beam traveling direction and at least one x slit elongated in the x direction that is perpendicular to the ion beam traveling direction and the y direction, the first and second y slits and the at least one x slit formed in the xy plane of the single plate-shaped member, from a retreat position to a measurement position, the retreat position being away from an original ion beam during ion implantation onto a substrate;
shaping the original ion beam into a measuring ion beam by using the plurality of apertures of the mask located at the measurement position, wherein the measuring ion beam comprises at least one first y beam part and at least one second y beam part each elongated in the y direction and shaped by the at least one first y slit and the at least one second y slit, respectively, and at least one x beam part elongated in the x direction and shaped by the at least one x slit;
detecting x-direction positions of the first and second y beam parts using a moving detector arranged downstream of the mask in the ion beam traveling direction and that is movable in at least the x direction so as to traverse the measuring ion beam;
detecting a y-direction position of the at least one x beam part, using a fixed detector arranged downstream of the moving detector in the ion beam traveling direction and comprising an array of detection elements arranged in the y direction, based on a y-direction position at which the at least one x beam part arrives on the array of detection elements;
calculating an x-direction beam angle using the x-direction positions; and
calculating a y-direction beam angle using the y-direction position, wherein
the original ion beam is a scanned ion beam scanned over a scanning range extending in the x direction,
the at least one first y slit is located at a first end part of an irradiated region of the single plate-shaped member on which the scanned ion beam is incident, the at least one second y slit is located at a second opposite end part of the irradiated region, and the at least one x slit is located between the at least one first y slit and the at least one second y slit,
the at least one first y slit, the at least one x slit, and the at least one second y slit are arranged along the x direction within the irradiated region of the single plate-shaped member.

18. The ion beam measuring device according to claim 1, wherein the at least one first y slit comprises a plurality of first y slits located at the first end part of the irradiated region of the single plate-shaped member, the first y slits arranged adjacently in the x direction and having the same slit shape, and
the at least one second y slit comprises a plurality of second y slits located at the second part of the irradiated region of the single plate-shaped member, the plurality of second y slits arranged adjacently in the x direction and having the same slit shape.

19. The ion beam measuring device according to claim 1, wherein the measuring ion beam comprises at least one third y slit elongated in the y direction, the plurality of apertures including at least one third y slit elongated in the y direction and shaping the at least one third y beam part, the at least one third y slit formed in the xy plane of the single plate-shaped member and located at a center part of the irradiated region,
the at least one first y slit, and at least one second y slit, the at least one third y slit, and the at least one x slit are arranged along the x direction within the irradiated region of the single plate-shaped member.

\* \* \* \* \*